United States Patent [19]

Mims

[11] Patent Number: 4,607,782

[45] Date of Patent: Aug. 26, 1986

[54] METHOD AND APPARATUS FOR SOLDERING ELECTRICAL COMPONENTS TO CIRCUIT BOARDS

[75] Inventor: Bruce L. Mims, Greens Farms, Conn.

[73] Assignee: Contact Systems, Inc., Danbury, Conn.

[21] Appl. No.: 737,538

[22] Filed: May 24, 1985

[51] Int. Cl.⁴ ............................ B23K 1/12; B23K 1/02
[52] U.S. Cl. ................................. 228/180.2; 228/6.2; 228/248; 228/253; 427/357
[58] Field of Search ............... 228/180.1, 180.2, 253, 228/248, 6.2; 427/277, 356, 357

[56] References Cited

U.S. PATENT DOCUMENTS

| | | | |
|---|---|---|---|
| 2,582,685 | 1/1952 | Eisler | 427/277 X |
| 3,516,155 | 6/1970 | Smith | 228/180.2 X |
| 3,958,740 | 5/1976 | Dixon | 228/180.2 X |
| 4,001,464 | 1/1977 | Doutrich et al. | 427/357 X |
| 4,311,267 | 1/1982 | Lim | 228/248 |
| 4,396,140 | 8/1983 | Jaffe et al. | 228/180.2 |
| 4,421,266 | 12/1983 | Bock | 228/180.2 |

Primary Examiner—Kenneth J. Ramsey
Attorney, Agent, or Firm—Edward R. Hyde

[57] ABSTRACT

An apparatus and method for soldering miniaturized electrical components to the surface of PC boards. A layer of solder paste is provided, into which the contact portions of electrical component leads are pressed. The component with solder paste adhering to the leads is moved to its placement station on the board and placed thereon with the leads contacting their respective pads.

16 Claims, 11 Drawing Figures

METHOD AND APPARATUS FOR SOLDERING ELECTRICAL COMPONENTS TO CIRCUIT BOARDS

BACKGROUND OF THE INVENTION

The present invention relates to a new and improved method and apparatus for soldering miniaturized electrical components to printed circuit (PC) boards and more particularly to soldering components having depending leads to the mounting surface of a printed circuit board.

A type of printed circuit board construction that has found extensive utility and popularity in recent years is direct surface mounting of the components on one or both surfaces of the board. This is in distinction to the prior through-the-hole mounting wherein the component leads would be inserted in holes in the PC and soldered to the circuit on the opposite side. Surface mounting provides particular advantages over through-the-hole mounting that are well known in the art.

In conventional surface mountings solder is screened onto one side of the board in selective locations and the components are then placed upon the board with the solder pads on the board matched to the footprints made by the components package. The solder must then be reflowed by heating and melting to complete the operation. An alternative to reflowing is by wave soldering. Reference is made to the publication Electronics, Feb. 9, 1984, pages 113-124 for a description of prior art techniques for surface mounting components with leads to PC boards.

As seen from the cited publication various commercially available machines provide automatic placement and mounting of the components.

These machines provide both automatic and semiautomatic surface mounting of components on PC boards. The machines will pick a component from a supply station by a vacuum pick-up head, move it to its location over the PC board and place it down on the previously solder screened PC. Thereafter by reflow soldering the components are secured in position.

In the prior art surfacing mounting methods and apparatus, the PC board must first be solder screened in the reflow method or wave soldered. The present invention contemplates an entirely new technique for suface mounting leaded components. In particular, a leaded surface mounted device (SMD) is picked up and solder paste is applied to the leads prior to placing the component on the PC. Thereafter the board is heated in order to reflow the solder paste by one of several methods known in the art, for example convection, conduction and vapor phase in order to secure the components in place on the PC board. The primary advantage of this method is that it eliminates the need for solder screening the board as in prior art methods.

SUMMARY OF THE INVENTION

Therefore, with the foregoing in mind it is a primary object of the present invention to provide a new and improved apparatus and method for soldering leaded components for surface mounting to printed circuit boards.

A further object of the invention is to provide an improved method for soldering leaded surface mounted devices to printed circuit boards in which solder paste is applied to the ends of the leads of the SMD prior to its placement on the PC board.

A further object of the invention is to provide a method for surface mounting leaded components to a PC board without the need for first solder screening the PC board.

A still further object of the invention is to provide apparatus for surface mounting components to a PC board in which the ends of the component leads have solder paste applied thereto prior to their placement on the board.

In accordance with these and other objects of the invention there is provided a surface mounted device (SMD) assembly system having multiple stations at which the various steps in the mounting procedure are performed. A supply station serves as a source of SMD's which may be of various types. These are selectively and individually picked up and moved to a solder application station of unique design where an appropriate amount of solder paste is applied to the leads while avoiding any solder contact with the body of the device.

The selected SMD with solder paste on the ends of the leads is then moved to a placement station where the device is set down with its leads contacting the terminal pads on the board. Thereafter the PC board with the components thereon are moved to an oven for reflow soldering.

Other objects of the invention will become apparent from the following more detailed description taken with the accompanying drawings.

DETAILED DESCRIPTION

Figure 1:
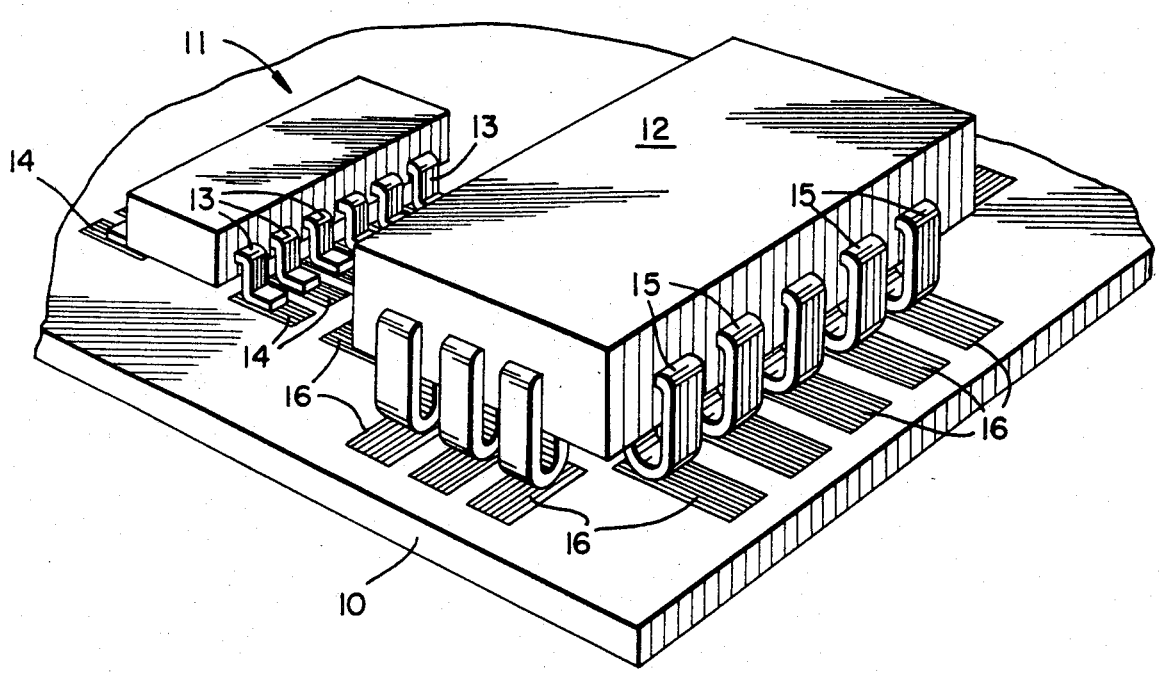
FIG. 1 is a perspective view of a portion of a PC board having two SMD's thereon.

Referring now to the drawings and more particularly to FIG. 1 numeral 10 indicates a portion of a PC board of any well known construction as epoxy-glass or paper-laminate. Mounted to the upper surface of the PC are two SMD 11 and 12 mounted thereon.

Component 11 is shown as a small outline integrated circuit (SOIC) which may be of a size 0.25×0.34 inches and 0.055 inches high. The unit shown is a 12 pin SOIC with six leads on each opposite side. Other SOIC's have 8, 14, 16, 20 etc. leads. The leads 13 are of the well known gull-wing type in which the end of the lead is bent outward with the outer flat end portion of each resting upon its respective pad 14 to which it is soldered by the novel technique hereinafter described. Component 12 is of the type known as a plastic leaded chip carrier having leads 15 on all four sides which have J-bends with the outer bottom of the bends resting upon and soldered to their respective terminal pads 16.

Figure 2:
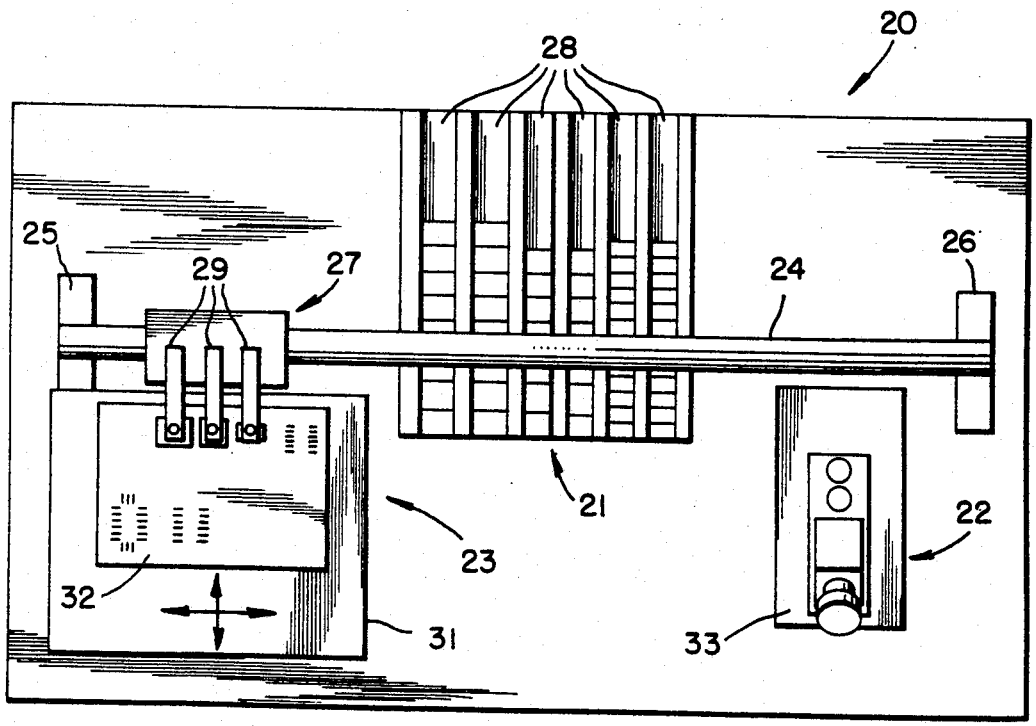
FIG. 2 is a schematic plan view of the apparatus of the present invention.

Referring now to FIG. 2 there is diagramatically shown in plan an apparatus for carrying out the method of the present invention. Numeral 20 represents the overall SMD assembly system having a supply station 21, solder application station 22 and placement station 23. Extending somewhat above and across these stations is a stationary bar or rod 24 mounted upon end supports 25, 26. A pick up head 27 is mounted to the bar 24 and through any suitable motor arrangement travels back and forth along the bar to the three operation stations. The general type of mechanism for selectively moving the pick up head from station to station is well known in the art and is shown for example in U.S. Pat. No. 3,958,740.

A supply of SMD's are loaded at the supply station. As shown there are six tubes 28 each containing a number of SMD's of a particular type for the particular board being assembled. Other types of SMD supply arrangements could also be used. The traveling head 27 contains depending vacuum pick-up tubes 29, these being three such tubes shown in FIG. 2.

Placement station 23 includes an X-Y table 31 that can be moved in either coordinate direction, either automatically under computer control or manually or a combination of both. In operation a PC board 32 is located on the table and appropriately placed by movement of the table to receive the SMD from the vacuum pick-up tube.

Figure 9:
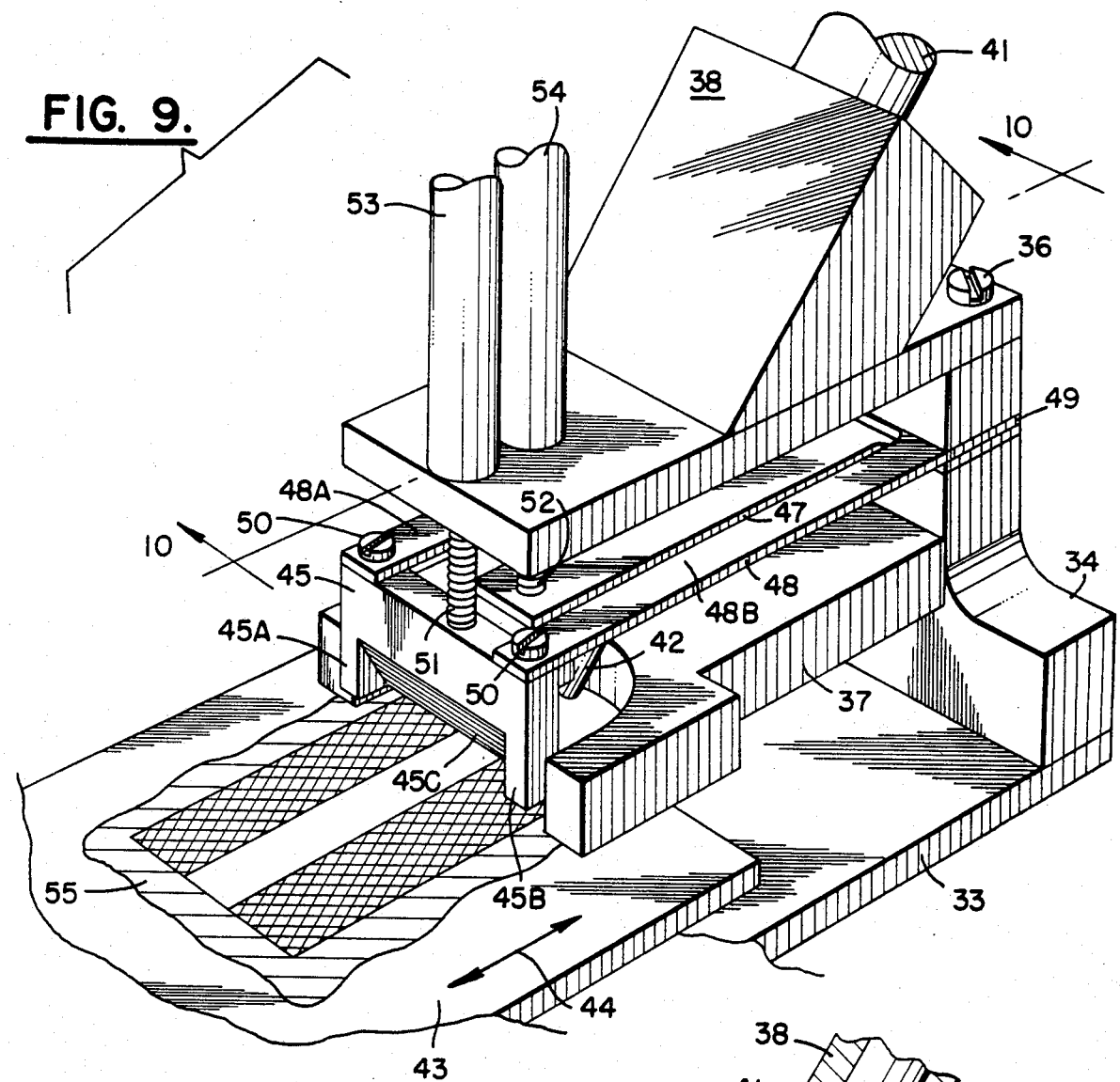
FIG. 9 is a perspective view of a portion of the solder application station showing the mechanism for providing the solder paste smears.
Figure 10:
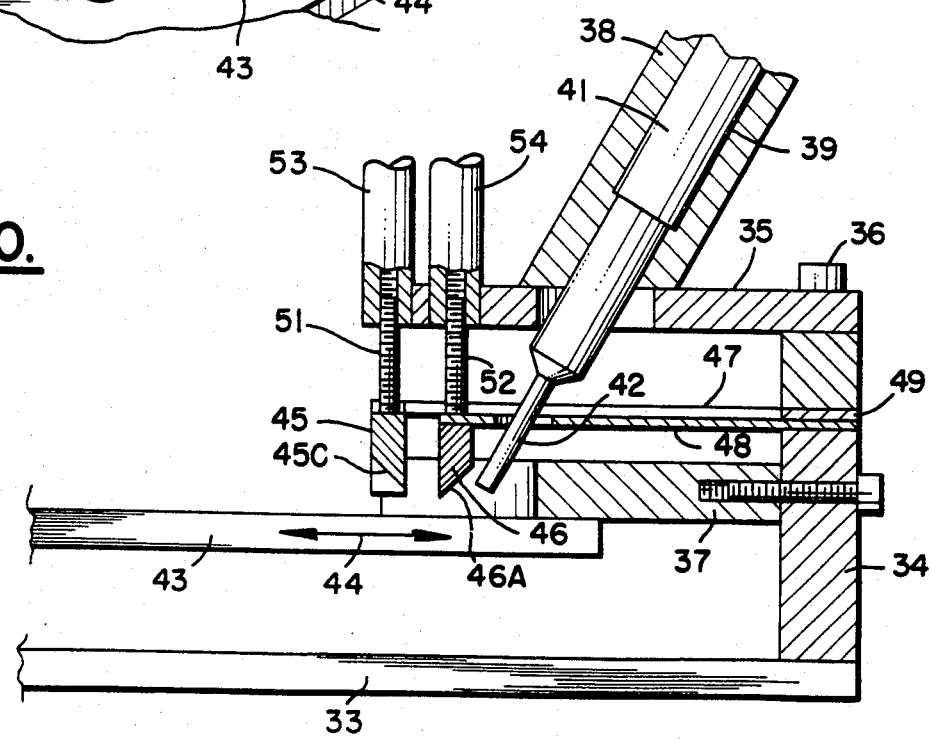
FIG. 10 is a cross section taken on the line 10—10 of FIG. 9.

The solder application station 22 is shown in detail in FIGS. 9 and 10. A stationary base plate 33 is secured in place at the application station and has an upstanding bracket 34 secured thereto. An upper mount 35 is secured to the rear bracket as by machine screws 36 and an intermediate bracket 37 extension parallel to the base plate 33 and upper mount 35.

A block 38 secured to the upper surface has a hole 39 bored therethrough to receive a solder paste plunger 41 which terminates in a tubular end 42 through which solder paste is expelled onto a flat solder paste plate 43 which is selectively reciprocated back and forth as indicated by arrows 44.

Positioned above the plate 43 are two blade-like shutters 45 and 46 which will be described in detail hereinafter. The shutters 45 and 46 are mounted at the inner ends of flexure brackets 47 and 48 respectively, the outer ends thereof being received in a slot 49 in a friction fit in bracket 34. Thus numbers 47, 48 may be flexed up and down whereby the shutters are selectively lowered into close proximity to the solder paste plate 43.

As seen in FIG. 9, flexure 48 is U-shaped with the two arms of the U designated 48A and 48B. The outside shutter 45 is secured to the ends of the U arms 48A and 48B by machine screws 50. Thus shutter 45 may be raised and lowered with the flexing of flexure 48. Inside shutter 47 is a straight parallel sided arm of a width to permit it to fit in the space between the arms 48A, 48B of flexure 48 and thus either inside shutter 46 or outside shutter 45 may be lowered into the proximity of plate 43 without interfering with the other.

As shown in FIG. 10, the shutters 45 and 46 secured to the ends of flexures 47 and 48 respectively may also secured to the lower ends of activiating plungers 51 and 52 respectively, the upper portions of which are received within hollow tubes 53, 54. The latter are suitably connected to a pneumatic system that selectively applies pressure to plungers 51, 52 to depress either inside shutter 46 or outside shutter 45.

Figure 4:
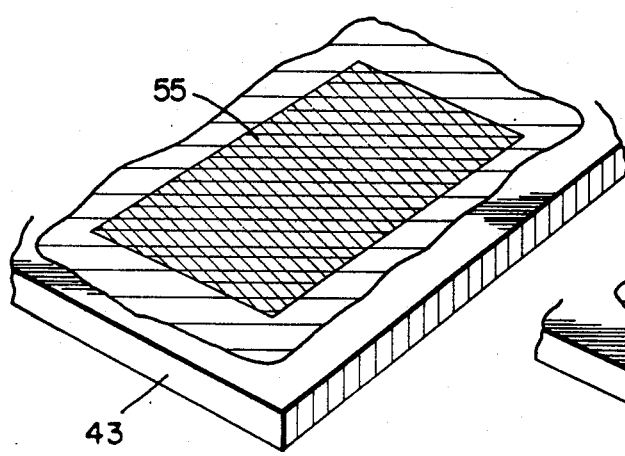
FIG. 4 is a view of a surface at the solder application station having a thin broad solder paste smear thereon.
Figure 7:
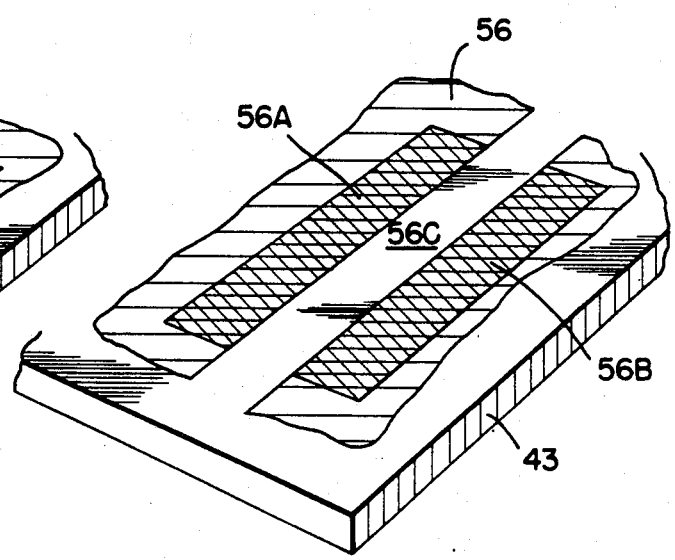
FIG. 7 is a view of a surfact at the solder application station having two thin tracks of solder paste thereon.
Figure 5:
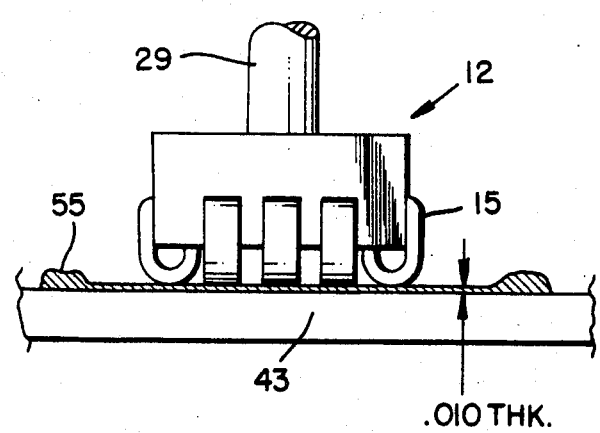
FIG. 5 is a side view of a plastic leaded chip carrier having solder applied to the leads thereof, at the solder application station.

The sequence of operational steps at the application station is that with the mechanism in the position shown in FIG. 10, a predetermined quantity of solder paste is expelled from the dispenser tube 42 onto the plate 43. Through the pneumatic system either shutter 45 or both shutters 45, 46 are depressed. If the former, it will be lowered until its outer feet 45A and 45B contact plate 43 at which point the blade portion 45C of the shutter will be about 0.010 inch above the plate. The latter will then reciprocate outward or to the right as viewed in FIG. 10 to cause the blade portion 45C of the outside shutter (assuming that it is the depressed shutter) to smear the paste in a thin layer 55 as shown in FIG. 4. If both shutters are depressed rather than just outside shutter 45, the blade portion 46A will be in contact with plate 43 and a solder paste smear as shown at 56 in FIG. 7 will result. The latter consists of two paste tracks 56A and 56B with a clean strip between them where the inner shutter 46 was in contact with table 43. Thus it is seen that there are two modes of operation i.e. the single broad smear resulting from the depression of outer shutter 45 during reciprocation of the table and the two track smear resulting when both shutters are depressed.

Figure 3:
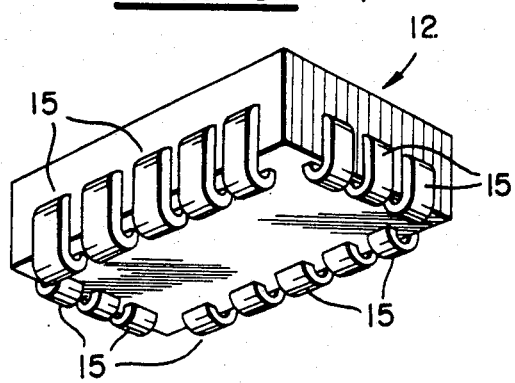
FIG. 3 is a perspective view of a plastic leaded chip carrier (PLCC) showing J-bend leads.
Figure 6:
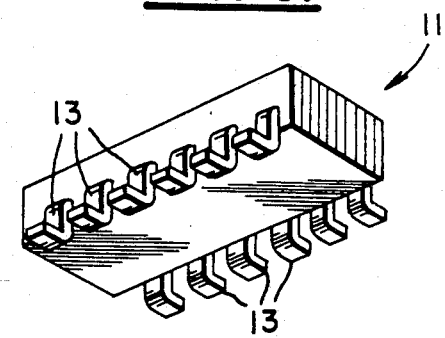
FIG. 6 is a perspective view of a small outline integrated chip (SOIC) showing the gull-wing leads.

Referring now to FIGS. 3 and 6 there are shown two types of components. A PLCC and SOIC respectively. These are the same as the corresponding units shown in FIG. 1 mounted on the PC board 10 and carry the same reference numerals as in FIG. 1.

In operation when it is desired to apply solder to the leads of a PLCC, a single solder paste smear as 55 is produced by the outside shutter 45. The component 12 is lowered and pressed against the smear and then raised with the solder paste adhering to the ends of the J-bend leads.

When applying solder to the gull-wing leads of an SOIC a two track smear as 56 is made by the depression of both shutters during reciprocation of the solder paste table 43. Thus when the SOIC 11 is lowered, each line of leads contacts one of the tracks 56A, 56B of solder paste. This insures that solder is not brought into contact with the underside of the SOIC.

The distance between the undersurface of PLCC 12 and the bottom bent portion of the J-bend is approximately 0.030 inches which is sufficient so that the solder paste will not reach the underside surface when the PLCC is lowered into the solder smear which may be 0.010 inches thick. On the other hand, the distance from the underside of an SOIC 11 to the bottom 14 of the gull-wing leads is approximately 0.005 inches. Thus it is desirable to have a clear solder paste-free strip 56C to insure against paste coming into contact with the underside of the SOIC. The width of the strip 56C may be for example 0.150 inches, generally corresponding to the distance between the two rows of parallel leads.

The sequence of operation of the system will now be described.

Supply Station

Initially components to be mounted are placed in tubes at the supply station. In the specific embodiment herein shown, the components are PLCC's and SOIC's. It is of course understood that the invention is also applicable to other surface-mounted devices having extending leads. Also, the tube or magazine supply is shown by way of example. The traveling head 27 will be automatically moved along the bar 24 to bring one or more of the three vacuum pick-up tubes over the SMD supply tubes at the supply station. The pick-up tube is lowered and the SMD is raised into traveling position.

Solder Application Station

Figure 8:
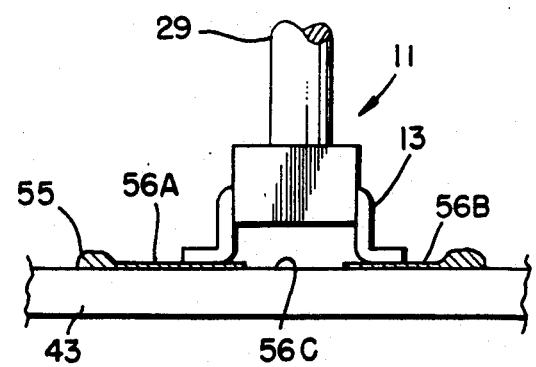
FIG. 8 is a side view of a small outline integrated circuit having solder paste applied to the leads thereof at the solder application station.

The head 27 then carries the selected SMD to the station 22. At this time, an amount of solder paste is expelled out of the solder paste supply tube end 42 onto the solder paste table which is in the position shown in FIG. 10. If the particular SMD is of the SOIC type, both shutters 45, 46 are depressed by pneumatic operation through tubes 53, 54 and the table 43 is reciprocated to the right as viewed in FIG. 10, resulting in a paste smear as 56 in FIG. 7. It is not necessary that an amount of solder paste be expelled in each cycle for each component. A single amount of solder paste will often suffice for a number of cycles and a number of components. Also the volume of solder paste that is placed on the table 43 may be different for different applications and components. It should be noted that the inward end of bracket 37 is U-shaped with its bottom surface bearing against the upper surface of table 43. This serves to maintain the solder paste in place on table 43 with repeated reciprocations thereof. That is, reciprocations of 43 would tend to move the solder further to the right on the table 43 as viewed in FIG. 10. Thus the U-shaped end prevents this tendency and maintains the paste on table 43. The vacuum pick-up tube holding the SOIC is lowered to press the component into the paste as shown in FIG. 8 where the bottom surfaces 14 of the leads 13 receive an appropriate amount of solder paste. The vacuum tube is then raised and the SOIC is returned to the hover position, ready to be conveyed to the placement station. If the component SMD to receive solder paste is a PLCC, then only the outer shutter would have been depressed to provide a single paste smear as 55 in FIG. 4.

Placement Station

At the placement station a PC board 32 is located on the X-Y table 31 which is automatically or semi-automatically moved to bring the proper position of the board into place, The head has moved the SMD with the solder on the leads from the applicator station to the placement station where the vacuum tube 29 is lowered to place the SMD on its pads. Thereafter, the assembled PC board is moved manually or automatically to a suitable oven or heater where the SMD's are reflow soldered.

Figure 11:
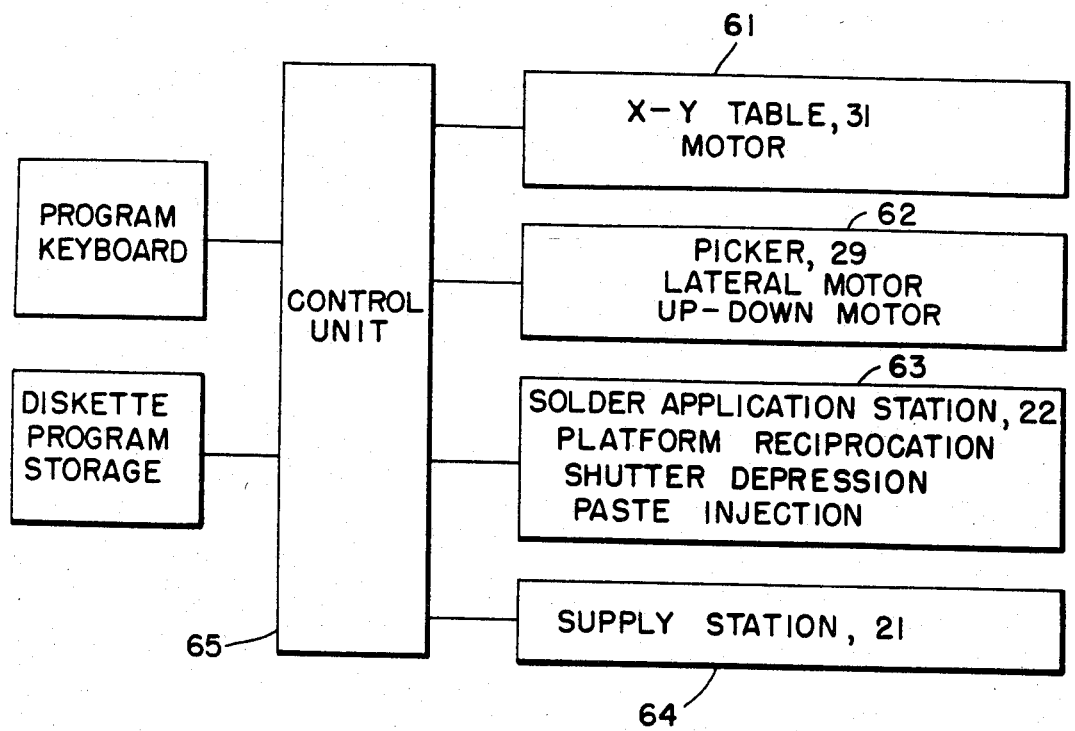
FIG. 11 is a block diagram of the control system.

The various movements and operations of the system may be computer controlled being self programming and using diskette program storage. The specific controlling mechanism may be of any convenient design well known in the art and is shown in block diagram in FIG. 11. The various mechanical movements are designated in blocks 61, 62, 63, 64 under control of a central control unit and may be programmed for the users needs.

While the invention has been particularly shown and described with reference to a preferred embodiment thereof, it is understood that various changes and modifications thereof may be made without departing from the scope and spirit of the invention as defined in the appended claims.

What is claimed is:

1. A method for surface mounting electronic components having depending leads to a printed circuit board having terminal pads comprising the steps of:
   providing a layer of solder paste of predetermined thickness;
   pressing the outermost portion of the leads into said layer of solder paste;
   separating the component leads from the layer of solder paste; and
   placing the component on the printed circuit board in its placement position with the outermost portions of the leads with solder thereon in contact with the component's terminal pads.

2. The method according to claim 1 in which said layer of solder paste is provided on a flat, smooth surface.

3. The method according to claim 1 in which said layer of solder paste is comprised of two portions separated by a solder paste free area.

4. The method according to claim 3 in which the depending leads are at opposite sides of the component and the leads on each one side are pressed into a different one of said two portions of said layer of solder paste.

5. A method for surface mounting electronic components having a plurality of leads to a predetermined placement position on a printed circuit board wherein the placement position has a plurality of terminal pads corresponding to the plurality of leads on the electronic component comprising the steps of:
   providing an amount of solder paste upon a surface;
   providing relative movement between said surface and a straight edge implement located a predetermined distance over the said surface to provide a layer of solder paste thereon;
   pressing the contact ends of the component leads in the layer of solder paste;
   separating the component leads from the layer of solder paste whereby an amount of solder paste adheres to the contact end of each lead;
   placing the component on the printed circuit board in its predetermined placement position with the contact ends of the leads in contact with their respective terminal pads;
   applying heat to the printed circuit board at a predetermined temperature to reflow the solder paste whereby the component is securely mounted to the board.

6. The method according to claim 5 in which the solder paste is provided on a flat, smooth surface.

7. The method according to claim 6 in which relative movement is provided between said surface and a second straight edge implement to separate the layer of solder paste into two portions separated by a paste-free area 8. Apparatus for surface mounting electronic components having a plurality of leads to predetermined positions on a printed circuit board comprising:
   a surface adapted to receive a supply of solder paste;
   means located adjacent the surface to apply an amount of solder paste to said surface;
   blade means locatable a predetermined distance from said surface;
   means to cause relative movement of said surface and said blade means whereby solder paste on said surface is spread into a layer of predetermined thickness;
   means to hold and transport an electronic component including means to move the component leads in close proximity to the said surface whereby the contact ends of the leads are impressed into the layer of solder paste;

means to move the component to a printed circuit board placement position whereby the contact ends of the component leads with solder paste thereon are brought into contact with their respective contact pads.

9. The apparatus according to claim 8 in which said blade means is located a first predetermined distance from said surface; and means to selectively move the blade means to a second predetermined distance from said surface.

10. The apparatus according to claim 8 including second blade means having a first position a predetermined distance from said surface and a second position in contact with said surface; and means to selective move said second blade means to said first and second positions.

11. The apparatus according to claim 8 in which said surface is smooth and flat.

12. The apparatus according to claim 9 including means in contact with said surface to maintain the solder on the surface during repeated relative movements between the surface and the blade means.

13. Apparatus for soldering electronic components having depending leads to the surface of a printed circuit board in a predetermined position thereon to terminal pads on the printed circuit board comprising:

electronic component supply means adapted to support a supply of components located at a first station;

solder paste application means adapted to apply solder paste to the contact ends of component leads located at a second station;

component placement means adapted to place components in placement positions located at a third station;

component transport means operable to transport components among said first, second and third stations;

said solder paste application means at said second station including surface means, means located adjacent the surface means to apply a quantity of solder to said surface means, blade means locatable a predetermined distance above said surface means, means to cause relative movement between said surface and said blade means whereby solder on said surface is spread into a layer of predetermined thickness on the surface means;

said component transport means being operable to transport a component from the said first station to the said second station and press the contact ends of the component leads into a layer of solder on the surface and including means to move the component from the second station to the third station to place the component in position on the printed surface board with the leaded terminals on their respective terminal pads.

14. The apparatus according to claim 13 in which said blade means is located a first predetermined distance from said surface; and means to selectively move the blade means to a second predetermined distance from said surface.

15. The apparatus according to claim 13 further including second blade means having a first position a predetermined distance from the said surface and a second position in contact with said surface; and means to selectively move said second blade means between the first and second positions.

16. The apparatus according to claim 15 in which the component leads are at two opposite sides of the component;

said means to provide relative movement between the surface and the blade means being operable to provide relative movement between the said surface and the said second blade means when the second blade means is in said second position whereby the layer of solder paste is formed into two portions separated by a solder paste free area.

* * * * *